United States Patent [19]

Schwee et al.

[11] Patent Number: 5,197,025

[45] Date of Patent: Mar. 23, 1993

[54] CROSSTIE RANDOM ACCESS MEMORY ELEMENT AND A PROCESS FOR THE FABRICATION THEREOF

[75] Inventors: Leonard J. Schwee; Paul E. Hunter, both of Burtonsville, Md.

[73] Assignee: The United States of America as represented by the Secretary of the Navy, Washington, D.C.

[21] Appl. No.: 615,728

[22] Filed: Nov. 19, 1990

Related U.S. Application Data

[63] Continuation of Ser. No. 386,389, Jun. 8, 1982, abandoned.

[51] Int. Cl.[5] .............................................. G11C 19/08
[52] U.S. Cl. ........................................ 365/87; 365/172
[58] Field of Search ................. 365/87, 88, 171, 172

[56] References Cited

U.S. PATENT DOCUMENTS

| | | | |
|---|---|---|---|
| 3,474,425 | 10/1969 | Jaeklin | 365/88 |
| 3,846,770 | 11/1974 | Schwee et al. | 365/88 |
| 3,868,659 | 2/1975 | Schwee | 365/87 |
| 3,868,660 | 2/1975 | Schwee | 365/87 |
| 3,997,884 | 12/1976 | Battarel et al. | 365/87 |
| 4,075,613 | 2/1978 | Torok | 365/87 |
| 4,080,591 | 3/1978 | Torok | 365/87 |
| 4,100,609 | 7/1978 | Schwee | 365/87 |
| 4,192,012 | 3/1980 | Schwee | 365/87 |
| 4,199,819 | 4/1980 | Schwee et al. | 365/87 |
| 4,231,107 | 10/1980 | Schwee | 365/87 |

OTHER PUBLICATIONS

Schwee et al., "The Concept and Initial Studies of a Crosstie Random Access Memory (CRAM)", J. Appl. Phys. 53(3), Mar. 1982, pp. 2762-2764.

Primary Examiner—Joseph A. Popek
Attorney, Agent, or Firm—Kenneth E. Walden; Jacob Shuster

[57] ABSTRACT

A nonvolatile random access memory is formed by thin permalloy shaped into "wiggle" patterns and magnetized to establish a plurality of memory cells arranged into an array. Magnetic domain walls are formed at apexes of the "wiggle" pattern in each memory cell after a predetermined magnetic field is applied along the hard axis of the memory cell array by magnetization so aligned. Row address lines for reading and writing into the memory cells and column address lines for writing into the memory cells are provided to conduct currents through each column of the array for magnetoresistance readout.

17 Claims, 2 Drawing Sheets

CROSSTIE RANDOM ACCESS MEMORY ELEMENT AND A PROCESS FOR THE FABRICATION THEREOF

BACKGROUND OF THE INVENTION

1. Field of the Invention

The present invention relates to magnetic storage devices generally, and in particular to a crosstie random access memory element together with a process for the production thereof as disclosed in my prior copending application Ser. No. 386,389 filed Jun. 8, 1982, now abandoned, with respect to which the present application is a continuation.

2. Description of the Prior Art

Electronic computers and other data processing devices, to a great extent, are limited by the speed, capacity, and reliability of their memory systems. Memory systems currently in use include tiny ring shaped ferrite cores strung on a mesh of fine wires (core memories) and semiconductor memories comprising transistor circuits laid down on tiny chips of silicon. At the present time the most common nonvolatile random access memory (RAM) in use is core memory. However, core memories having large storage capacity become bulky, heavy and extremely expensive compared to memories which can be fabricated using photolithographic techniques such as the aforementioned semiconductor memories. Unfortunately, for the most part, dense, light in weight semiconductor memories are volatile. The exception is MNOS semiconductor memories which take a relative long time to write and read and have limited retentivity. Consequently, there is a need in the prior art to configure using photolithographic techniques a nonvolatile random access memory which is fast, but light in weight and low in cost.

In the prior art, an alternative to the foregoing memories stores data bits in the form of magnetic bubbles which move in thin films of magnetic material. These magnetic bubbles are actually cylindrical magnetic domains whose polarization is opposite to that of the thin magnetic film in which they are embedded. The magnetic bubbles are stable over a considerable range of conditions and can be moved from point to point at high velocity. Magnetic bubble memories are substantially cheaper than the core memories aforementioned, and much faster than magnetic disk memory systems which are widely used for high capacity storage. Magnetic bubble memories are analogous to magnetic disk memories, in that, in both systems, data is stored as states on, or in, a thin magnetic film. In a disk memory, the film is moved mechanically at high speeds. On the other hand, in a magnetic bubble memory, the magnetic bubbles move at high speeds throughout the thin magnetic film. As aforementioned, magnetic bubble memories are nonvolatile, hence, logical operations can be performed without reading or writing the stored data out/in again. Since, magnetic bubble memories do not have moving parts, they should operate reliably for long periods of time. However, a drawback of magnetic bubble memory devices is that single crystals with minimal defects are required for their fabrication. Moreover, it is difficult to produce large single crystals for high storage devices. Even the attempted use of amorphous materials does not eliminate the problem of high eddy currents which reduce the speed of the magnetic bubble domains. Even so, magnetic bubble memories have many advantages. Nevertheless, there is a need in the prior art to configure a nonvolatile random access memory using thin magnetic film technology, but yet be fast in access time and require the use of only polycrystalline materials.

As further background material, the present invention is an out growth of the crosstie memory technology disclosed primarily in U.S. Pat. No.: 3,846,770 to Schwee et al., entitled "Serial Access Memory Using Magnetic Domains in Thin Film Strips," filed Jul. 11, 1973, patented Nov. 5, 1974; U.S. Pat. No. 3,868,659 to Schwee, entitled "Serial Access Memory Using Thin Magnetic Films," filed Apr. 10, 1973, patented Feb. 25, 1975; U.S. Pat. No. 3,868,660 to Schwee, entitled "Detector for Cross-tie Memory," filed Apr. 10, 1973, patented Feb. 25, 1975; U.S. Pat. No. 4,100,609 to Schwee, et al., entitled "Magnetoresistance Detector for Crosstie Memories," filed Sep. 3, 1976, patented Jul. 11, 1978; U.S. Pat. No. 4,192,012 to Schwee et al., entitled "Crosstie Memory Bit Stretcher Detector," filed Nov. 8, 1978, patented Mar. 4, 1980; and U.S. Pat. No. 4,231,107 to Schwee et al., entitled "Serriform Strip Crosstie Memory," filed Feb. 14, 1978, patented Oct. 28, 1980, all patents being assigned to the same assignee as the present invention.

Briefly, Schwee et al., '770 disclose a polycrystalline thin film strip for storing digital information serially in the form of reversal domains. The reversal domains are propagated along the thin film strip, e.g., of permalloy, and then sensed to detect the stored digital information.

Schwee, '659, discloses a serial access memory based on the propagation of crosstie walls and Bloch lines along domain walls in thin magnetic films. Variation of the current through conductors placed above the domain walls changes the fields along the walls causing the relocation of Bloch lines and crossties in the walls which causes propagation of the information contained in inverted Néel walls along the domain walls.

Schwee et al., '107, discloses a crosstie memory using a plurality of permalloy thin film strips of uniform thickness each strip having parallel denticulated margins etched to align with the oblong axis thereof. Each pair of opposite denticles defines a distinct memory cell.

The other Patents listed herein show additional prior art of crosstie memory development, and the development of certain types of detectors for use therewith. The disclosures in all of the listed patents are incorporated herein by reference.

The cited and discussed Patents do disclose certain versions and particular aspects of crosstie memories, but they do not disclose or teach, inter alia, the placing of magnetic domain walls into a matrix or array configuration using "wiggle" patterns to thereby create a random access memory element, nor do such patents teach the process for making this memory element.

The prior art, as indicated herein, teaches some advances in crosstie memories including devices for detecting or reading-out binary information therefrom. However, insofar as can be determined, no prior art device or process incorporates the features and advantages of the present invention.

OBJECTS OF THE INVENTION

Accordingly, a principal object of the present invention is to configure a nonvolatile random memory element having high bit density so as to be substantially faster and lighter in weight than present nonvolatile random access memories, but yet be lower in cost.

A corollary object of the above principal object is to configure the nonvolatile random access memory element using thin magnetic film and photolithographic techniques, but yet be faster in access time than magnetic bubble memories while requiring only polycrystalline material for the fabrication thereof.

Another object of the present invention is to configure a nonvolatile random memory element on a silicon substrate so as to be compatible with present day integrated circuit fabrication.

A corollary object of the above object is to configure the nonvolatile random access memory element so that a significant number of its masking levels can be folded in with the masking levels needed to connect transistors for encoding and decoding thereof.

Yet another object of the present invention is to configure the nonvolatile random access memory element to have non-destructive readout, but yet be low in cost.

Still another object of the present invention is to configure the nonvolatile random access memory element to have high bit density, but yet not generate excessive heat thereby eliminating the need for elaborate heat sinking.

A further object of the present invention is to configure the nonvolatile random access memory element to be resistant to radiation, but still be fast and low in cost.

SUMMARY OF THE INVENTION

In accordance with the above stated objects, other objects, features and advantages the present invention has as a primary purpose the fabrication of a nonvolatile random memory element having a high bit density that is fast and low in cost for use in computers, or with microprocessors and signal processors.

The essence of the present invention is in the use of permalloy thin films, inter alia, to configure the nonvolatile random memory element by placing and forming magnetic domain walls (Néel walls) in the permalloy into a matrix or array configuration.

The purpose of the present invention is carried out by depositing a first level of permalloy of 81—19 Ni-Fe onto a glass substrate or onto the oxide layer of a silicon substrate. The permalloy film is then etched into a plurality of juxtaposed columns of memory cells to form a matrix or array thereof. The plurality of juxtaposed columns of memory cells (memory cell array) are each configured into a unique "wiggle" pattern in each memory cell after a predetermined magnetic field is applied along the hard axis of the memory cell array and then reduced to zero. In this way, the magnetization is aligned properly for use of the memory cell array as a nonvolatile random access memory element. Each memory cell in the array is connected so that current can be passed through each column of the array for magnetoresistance readout. A second level comprises an insulator of silicon nitride or silicon monoxide having vias for connection to the permalloy columns of the array. A third level of 95-5 Al-Cu is deposited so as to fabricate a plurality of juxtaposed row conductors perpendicular to the permalloy columns of the array but above corresponding memory cells of the columns. These conductors form row address lines for reading/writing operations. A fourth level comprises another insulator layer having vias for connection to individual row address lines. A fifth level of 95-5 Al-Cu is deposited so as to fabricate a plurality of column conductors which "meander" above corresponding columns of the array traversing each memory cell therein in the same direction. These conductors form column address lines for the writing operation since writing is accomplished using coincident currents.

BRIEF DESCRIPTION OF THE DRAWINGS

The foregoing and other objects, novel features and advantages of the present invention will be more apparent from the following more particular description of the preferred embodiments as illustrated in the accompanying drawings, in which.

DESCRIPTION OF THE PREFERRED EMBODIMENTS

The following is a description of a crosstie random access memory element employing the present invention. A description of a process for fabricating the crosstie random access memory element, is also discussed in some detail.

Figure 1:
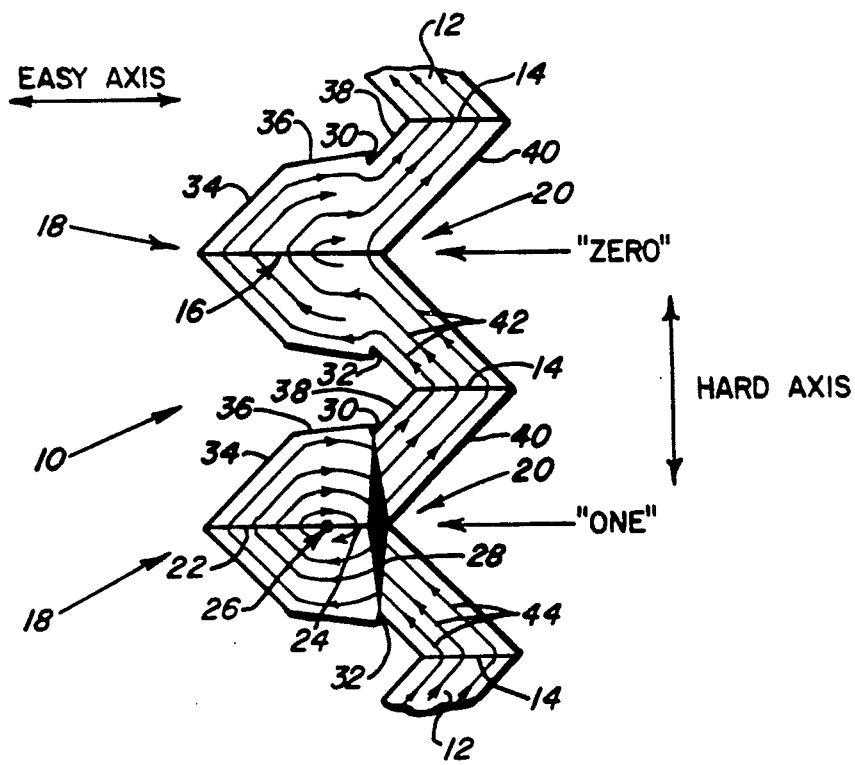
FIG. 1 depicts a unique "wiggle" pattern shape of a memory cell(s), and illustrates the directions of magnetization for a logic "zero" and a logic "one", according to the present invention.

Referring then to FIG. 1, the configuration of a plurality of memory cells 10 of a polycrystalline magnetic material such as a permalloy thin film 12 is illustrated. Also illustrated, is the direction of magnetization for a logic "zero" and a logic "one" for respective ones of memory cells 10. Each one of memory cells 10 is juxtaposed between adjacent ones of a plurality of 90° unipolar Néel walls 14. The etching of permalloy thin film 12 into a "wiggle" pattern of connected memory cells 10 is an important contribution of the present invention. The one of the memory cells 10 containing the logic "zero" condition includes a unipolar Néel wall 16 parallel to the easy axis and extending between one of a plurality of outside apexes 18 and a corresponding one of a plurality of inside apexes 20. The one of memory cells 10 containing the logic "one" includes a positive Néel wall portion 22 and a negative Néel wall portion 24 both being parallel to the easy axis. Positive Néel wall portion 22 extends between another one of outside apexes 18 and a Bloch line 26 which is a line of magnetic flux extending perpendicular to the plane of permalloy thin film 12. Negative Néel wall 24 extends between the aforementioned Bloch line 26 and a corresponding one of inside apexes 20. In this one of memory cells 10, a crosstie 28 extends between one of a plurality of top glitches of permalloy 30 and a corresponding one of a plurality of bottom glitches of permalloy 32.

Still referring to FIG. 1, the "wiggle" pattern is further formed by etching permalloy thin film 12 to include a plurality of top acute edges of permalloy 34 each joined to corresponding ones of a plurality of substantially parallel to the easy axis top edges of permalloy 36 which, in turn, join corresponding ones of the aforementioned top glitches of permalloy 30. Each one of a plurality of top short edges of permalloy 38 extends acutely from corresponding ones soft top glitches of permalloy 30 to the beginning of corresponding ones of 90° Néel walls 14. Each one of a plurality of top long edges of permalloy 40 extends down acutely from the end of corresponding ones of 90° Néel walls 14, aforementioned, to corresponding ones of inside apexes 20. This completes the description of the top half of a particular one of plurality of memory cells 10. But as shown, the bottom half of a corresponding memory cell is the mirror image of the top half thereof as mirrored about, for the example of the memory cell containing a logic "zero", unipolar Néel wall 16. The foregoing condition of configuration is correct for all of memory cells 10, and, accordingly, for clarity in FIG. 1, the mirrored images, except where already noted, are not numbered.

As further illustrated in FIG. 1, when a positive magnetic field of about 100 Oe is applied along the hard axes in the plane of permalloy thin film 12 (in an upward direction) and then reduced to zero, the magnetization as depicted by vectors 42, is properly aligned for use of the cells as a memory, and a logic "zero" will be present in all of memory cells 10. The magnetization alignment is shown in the top memory cell as aforementioned. The magnetization aligns itself parallel to the edges of the shape of permalloy thin film 12 to decrease magnetostatic energy. The edges influence the magnetization direction for several microns from each edge. The distance between memory cells 10 is about 20 microns. Now if a negative field of about 11 Oe is applied along the hard axis in the plane of permalloy thin film 12 (in a downward direction), and then reduced to zero, a crosstie will appear in all of plurality of memory cells 10. This magnetization, as depicted, inter alia, by vectors 44, is shown in the bottom memory cell as aforementioned. Consequently, the presence of a crosstie 28 and a Bloch line 26 pair is considered a logic "one" and the absence thereof a logic "zero". It should be mentioned that the magnetization directions as represented by vectors 42 and 44 remain parallel and in the same directions along the edges of the respective memory cells, whether a logic "one" or a logic "zero" is present. The predictable behavior of any one of memory cells 10 is predicated on the foregoing facts.

To eliminate the crosstie Bloch line pair, a positive field of above 15 Oe is required. As the field is applied, the Bloch line approaches the crosstie, by which it is repulsed, until contact is made and annihilation occurs. Then the field can be returned to zero and a "zero" will be present. At zero applied field a logic "one" or logic "zero" is stable.

Figure 2:
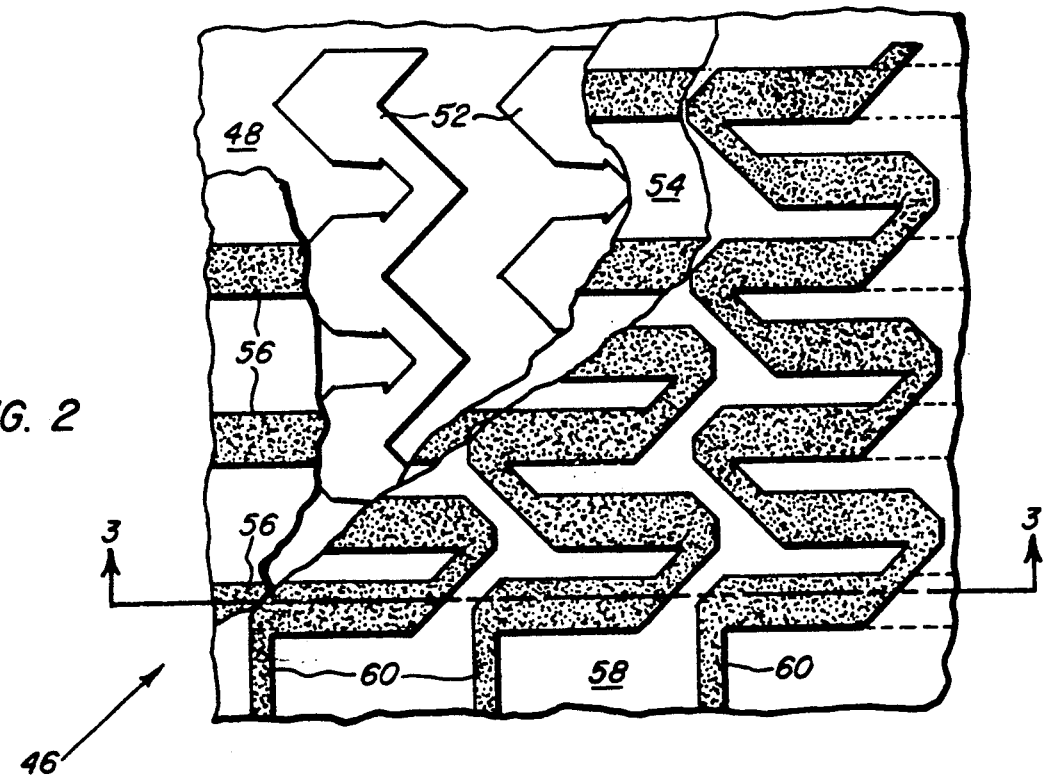
FIG. 2 is a top plan view of a crosstie random access memory element including, inter alia, an array of the memory cells of FIG. 1, a level of row conductors and a level of "meandering" column conductors.
Figure 3:
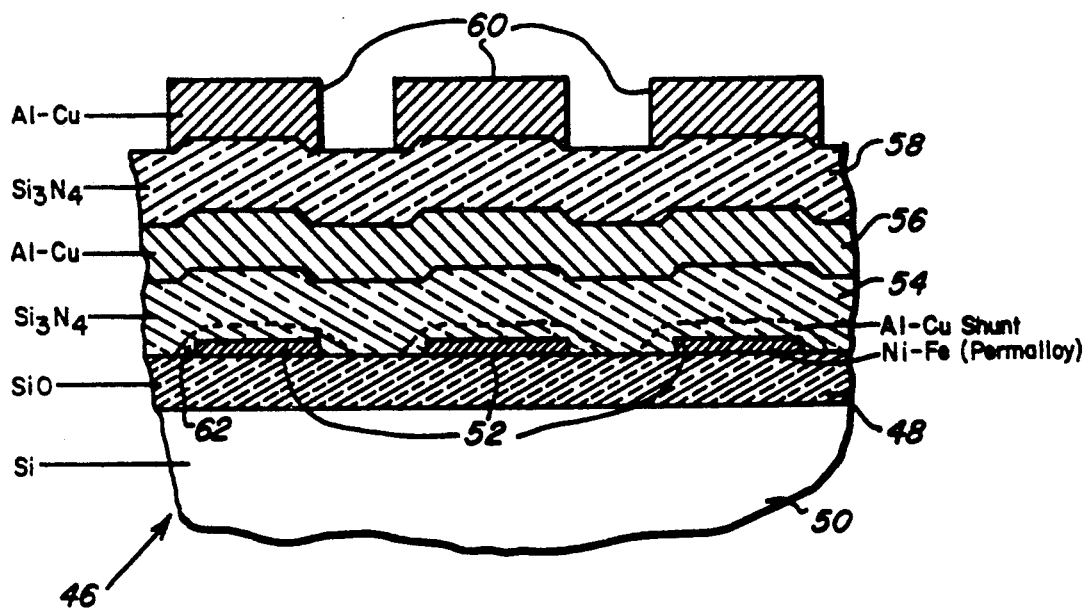
FIG. 3 is a sectional view depicting additional levels of fabrication of the crosstie random access memory element of FIG. 2 taken along lines 3—3 thereof.

Referring now to FIGS. 2 and 3 concurrently, a plan view of a preferred arrangement of a matrix or array of memory cells (crosstie random access memory element) 46 suitable for read and write operations along with a sectional view thereof are shown. A first level of memory element 46 is deposited on a suitable substrate comprising a silicon oxide layer 48 which has been grown on a silicon substrate 50 or on a glass substrate (not shown). This first level comprises a plurality of juxtaposed columns of memory cells 52 composed of memory cells 10 of permalloy thin film 12 (see FIG. 1). For purposes of illustration only, an array of three columns 52 each having four memory cells 10 are shown. This first level of memory element 46 is fabricated by first depositing 81-19 Ni-Fe using a physical vapor deposition process (either resistance heating or electron beam heating) or a sputtering process. This layer is patterned with the unique "wiggle" pattern using conventional photolithgraphic techniques and then etched chemically or with an ion beam miller. A second level of memory element 46 comprises an insulator layer 54 of silicon nitride or silicon monoxide having vias (not shown) for making connections to juxtaposed columns of memory cells 52. The vias in this level are created using a liftoff technique whereby photoresist plugs are removed in a heated acetone bath agitated with an ultrasonic agitator. This technique is believed to give superior stripping of the photoresist. A third level comprises a plurality of juxtaposed rows of conductors 56 of 95-5 al-Cu. The conductors 56 are fabricated to traverse adjacent and corresponding memory cells 10 of juxtaposed columns of memory cells 52 so as to be perpendicular to the juxtaposed columns. These conductors form the row read/write address lines for memory element 46. This level is fabricated using a liftoff process also. The pattern created is such that only areas of this level which are not to have Al—Cu on them are covered with photoresist and all other areas are left clear. The Al—Cu is then deposited in an ion beam coater. Then the metalization pattern is created by removing the photoresist on the areas intended to be free of metal by also using heated acetone in an ultrasonic agitator. A fourth level of memory element 46 comprises an insulator layer 58 also of silicon nitride or silicon monoxide and also having vias (not shown) for connection individually to the juxtaposed rows of conductors 56. This processing step is substantially the same as fabrication of level two. A fifth level comprises a plurality of juxtaposed meandering columns of conductors 60 also of 95-5 Al—Cu. The conductors 60 are fabricated to traverse corresponding ones of juxtaposed columns of memory cells 52 meandering up each column crossing above each memory cell 10 thereof in the same direction. This processing step is substantially the same as fabrication of level three. These meandering conductors form the column write address lines for memory element 46.

For purposes of the present invention, silicon oxide layer 48 is about 2000 Å thick, the first level of juxtaposed columns of memory cells 52 is about 400 Å, the second level of insulator layer 54 is about 2000 Å, the third level of juxtaposed rows of conductors 56 is about 1000 Å, the fourth level of insulator layer 58 is about 2000 Å, and the fifth level of juxtaposed meandering columns of conductors 60 is about 3000 Å. Note that these meandering column conductors are deposited about 2000 Å thicker than the row conductors to compensate for the increase in resistance due to the longer meandering current path required.

Figure 4:
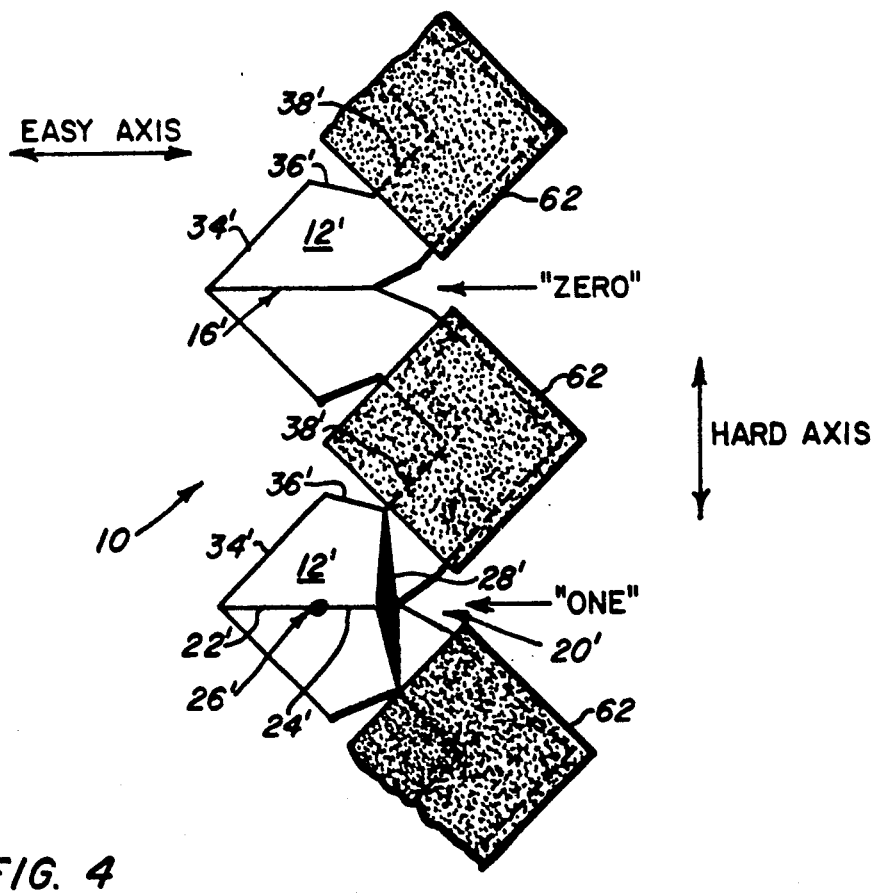
FIG. 4 depicts another embodiment of the memory cells of FIG. 1 and the placement of current shunts therebetween which are shown also in the sectional view of FIG. 3.

FIG. 4 depicts an improved shaped when compared to the embodiment of FIG. 1. The plurality of top and bottom glitches 30 and 32 have been eliminated as shown in FIG. 4. In order to predictably locate crosstie 28', the plurality of top acute edges of permalloy 34' are extended further than their counterparts in FIG. 1. Also, edges of permalloy 36' are no longer substantially parallel to the easy axis, but each edge forms a definitive angle therewith and is shorter than its counterpart. The shape changes tend to localize crosstie 28' at the transition part of corresponding top and bottom edges 36' and 38' and at inside apex 20' as shown. The foregoing configuration keeps Bloch line 26' farther removed from crosstie 28' thereby providing a more stable memory cell.

Still referring to FIG. 4 and again to FIG. 3, as viewed concurrently, a plurality of current shunts 62 of 95-5 Al—Cu having a thickness of about 1500 Å are disposed between adjacent ones of memory cells 10' on permalloy thin film 12'. Permalloy thin film 12' need not be continuous under plurality of current shunts 62. This process step, performed after deposition of the first level of juxtaposed columns of memory cells 52, decreases the resistance of a column of memory cells 52 by about 50%. This process step is accomplished by another liftoff process whereby photoresist covers all areas except where the Al—Cu current shunts are to be fabricated. Then an al—cu layer is deposited over the entire surface. Finally, the pattern is defined by stripping the photoresist using the heated acetone bath with the ultrasonic agitator aforementioned. Also, the signal to noise ratio and power dissipation are improved by this step and the previously mentioned shape change.

The desired properties of magnetic materials suitable for use with the present invention are zero magnetostriction, $H_k \sim 3.5$ Oe, $H_c \sim 1$ to 1.5 Oe, and the magnetostriction ratio, $\Delta R/R_o$, greater than 2.3%. Isotropic films may also be used in the fabrication of the present invention.

To these skilled in the art many modifications and variations of the present invention are possible in light of the above teachings. It is therefore to be understood that the present invention can be practiced otherwise than as specifically described herein and still be within the spirit and scope of the appended claims.

What is claimed is:

1. A crosstie random access memory element, comprising:
    a substrate;
    a first level of polycrystalline magnetic material configured into a plurality of juxtaposed columns of memory cells to form an array thereof; each one of said plurality of juxtaposed columns of memory cells being configured into a wiggle pattern;
    a second level of insulating material having vias for connection to each of aid plurality of juxtaposed columns of memory cells;
    a third level of conducting material configured into a plurality of juxtaposed row conductors perpendicular to said plurality of juxtaposed columns of memory cells, each one of said plurality of juxtaposed row conductors being disposed above corresponding memory cells of said plurality of juxtaposed columns of memory cells;
    a fourth level of insulating material having vias for connection to each one of said plurality of juxtaposed row conductors; and
    a fifth level of conducting material configured into a plurality of juxtaposed column conductors which meander above corresponding columns of said array traversing each memory cell therein in the same direction, said levels of the magnetic, insulating and conductivity materials being located in stacked relation to each other on the substrate.

2. The crosstie random access memory element of claim 1 wherein said substrate is glass.

3. The crosstie random access memory element of claim 1 wherein said substrate comprises a silicon oxide layer grown on a silicon substrate.

4. The crosstie random access memory element of claim 2 or 3 wherein said polycrystalline magnetic material comprises permalloy of 18-19 Ni-Fe, and wherein the thickness thereof is about 400 Å.

5. The crosstie random access memory element of claim 4 wherein the second and fourth levels of insulating material comprises silicon nitride having a thickness at each level of about 2000 Å.

6. The crosstie random access memory element of claim 5 wherein the third level of conducting material comprises 95-5 Al—Cu having a thickness of about 1000 Å.

7. The crosstie random access memory element of claim 6 wherein the fifth level of conducting material comprises 95-5 Al—Cu having a thickness of about 3000 Å.

8. The crosstie random access memory element of claim 7 comprising an additional level between the first and second levels comprising current shunts disposed on said permalloy between adjacent ones of said memory cells in a juxtaposed column thereof, said current shunts being configured to reduce the resistance of a juxtaposed column of memory cells.

9. The crosstie random access memory element of claim 8 wherein the permalloy under said current shunts is 3 discontinuous.

10. The crosstie random access memory element of claim 9 wherein each current shunt comprises 95-5 Al—Cu having a thickness of about 1500 Å.

11. In a method of fabricating a random access memory, including deposit of a plurality of levels of material on a substate, the improvement residing in: configuring one of said levels as wiggle patterned films; magnetizing said films to form a plurality of memory cells therein within which data may be stored; and establishing through the other levels connections between the memory cells forming columns and rows thereof in an array through which read and write operations may be performed with respect to said data.

12. In a crosstie random access memory having a substrate and a plurality of levels of material deposited thereon, the improvement residing in: one of said levels being magnetized films configured into wiggle pattern shape to form memory cells within which data is stored and conductor means formed in the other of the levels for interconnecting the memory cells in an array of columns and rows through which write and read operations are performed with respect to said data.

13. The improvement as defined in claim 12 wherein magnetization of the films is aligned along different directions between spaced magnetic domain walls alternately extending between and through said memory cells.

14. The improvement as defined in claim 13 wherein the magnetic domain walls extending between the memory cells are unipolar.

15. The improvement as defined in claim 13 wherein the magnetic domain walls extending through the memory cells are either unipolar or bipolar dependent upon different logic data storing conditions of the memory cells.

16. The improvement as defined in claim 12 wherein said wiggle pattern shape of the films establishes a plurality of aligned inner and outer apexes between which magnetic domain walls extend in parallel spaced relation to each other.

17. The improvement as defined in claim 16 wherein the magnetic domain walls extending through the memory cells are either unipolar or bipolar dependent upon different logic data storing conditions of the memory cells.

* * * * *